United States Patent
Yeh (10) Patent No.: US 7,414,888 B2
(45) Date of Patent: Aug. 19, 2008

(54) PROGRAM METHOD AND CIRCUIT OF NON-VOLATILE MEMORY

(75) Inventor: Chih-Chieh Yeh, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 0 days.

(21) Appl. No.: 11/233,624

(22) Filed: Sep. 22, 2005

(65) Prior Publication Data

US 2007/0064487 A1    Mar. 22, 2007

(51) Int. Cl.
*G11C 11/34*    (2006.01)
(52) U.S. Cl. .......................... 365/185.17; 365/185.08; 365/185.05; 365/185.28
(58) Field of Classification Search ............ 365/185.17, 365/185.08, 185.05, 185.28
See application file for complete search history.

(56) References Cited

U.S. PATENT DOCUMENTS

| 5,768,192 | A | 6/1998 | Eitan | 365/185.24 |
|---|---|---|---|---|
| 6,567,315 | B2 | 5/2003 | Takase et al. | 365/185.28 |
| 6,690,601 | B2 | 2/2004 | Yeh et al. | 365/185.28 |
| 6,781,890 | B2 | 8/2004 | Tanaka et al. | 365/189.09 |
| 2002/0024515 | A1* | 2/2002 | Booth et al. | 345/211 |
| 2004/0032788 | A1* | 2/2004 | Sakui et al. | 365/223 |
| 2004/0100826 | A1* | 5/2004 | Cho | 365/185.28 |
| 2004/0119109 | A1* | 6/2004 | Kang | 257/315 |
| 2006/0203598 | A1* | 9/2006 | Akaogi | 365/230.06 |

* cited by examiner

*Primary Examiner*—Hoai V. Ho
*Assistant Examiner*—Jason Lappas
(74) *Attorney, Agent, or Firm*—J.C. Patents (57) ABSTRACT

A circuit of non-volatile memory which includes a plurality of memory units is disclosed. The memory unit comprises a first switch, a second switch, a data line, a voltage storage component, and a plurality of memory components connected in series. The first terminal of the first switch is coupled to the first voltage. The data line is coupled to the second terminal of the first switch. The first terminal of the voltage storage component is coupled to the data line, and the second terminal of the voltage storage component is coupled to the ground. The first terminal of the second switch is coupled the data line. In addition, the third terminal of each memory component is coupled to the first terminal of the next memory component, and the second terminal of the each memory component is coupled to second voltage.

20 Claims, 5 Drawing Sheets

PROGRAM METHOD AND CIRCUIT OF NON-VOLATILE MEMORY

BACKGROUND OF THE INVENTION

1. Field of the Invention

This invention generally relates to a non-volatile memory, and especially to a program method and circuit of non-volatile memory, which utilizes a constant charge type for programming storage state.

2. Description of Related Art

Figure 1:
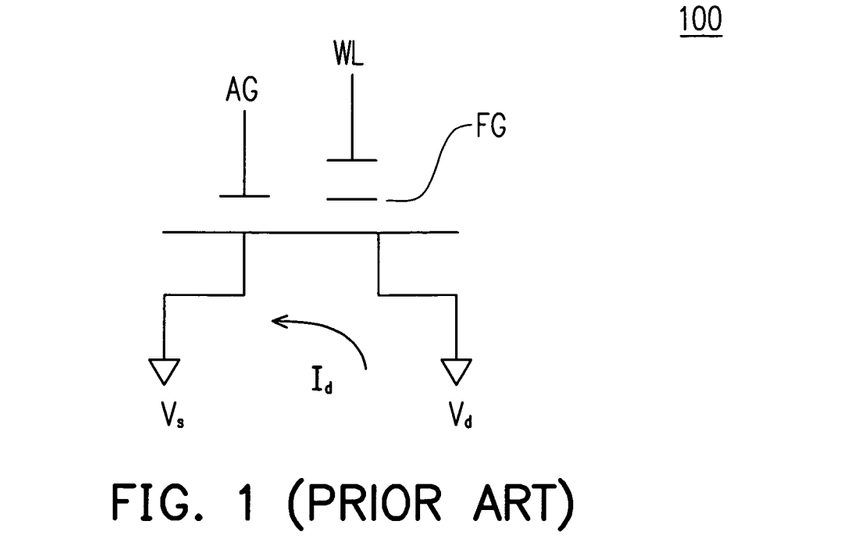
FIG. 1 is a drawing, schematically showing a view of a conventional AG-AND type memory.

FIG. 1 is a drawing, schematically showing a view of a conventional AG-AND type memory. As shown in FIG. 1, when a current Id flows from a terminal Vd to a terminal Vs, an AG-AND memory 100 can conveniently injects and stores electrons into a floating gate (FG) of the memory 100 to accomplish the programming storage action of the memory. The most difference between the AG-AND memory 100 and a common transistor is that the gate electrode terminal comprises two control terminals which are the terminal WL and the terminal AG, so that when the current Id from the terminal Vd to the terminal Vs will be conducted by the AG-AND memory 100, the voltages of two terminals WL and AG must be controlled at same time in order to perform the programming action at this time.

In a common manufacture process of the AG-AND memory 100, the current channel in the each AG-AND memory is different which is caused by manufacturing process, it means that the length and the width of the current channel in each of the AG-AND memory 100 is different when accomplishing the manufacture, so that the stored electric charge amount is also different when the electrons are injected into the terminal FG through the current Id. For example, when the channel length of the AG-AND memory 100 is longer, the necessary time of injection must be longer, whereas, when the channel length of the AG-AND memory 100 is shorter, the necessary time of injection is relatively shorter. But, when the time of injecting the current Id is too short, it can be caused that amount of the electrons stored in the terminal FG is not enough, therefore the correctness of the programming result of the AG-AND memory 100 at this time is affected.

Further, excepting the above mentioned problem, an initial threshold voltage Vt of the each AG-AND memory 100 can also affect the injection time of the current Id. When critical voltage Vt of the each AG-AND memory 100 is higher, the current Id is lower, therefore the amount of the electrons injected into the terminal FG of the AG-AND memory 100 is lower. Whereas, when initial threshold voltage Vt is too low, the amount of the electrons injected into the terminal FG of the AG-AND memory 100 is relatively higher. In order to solve and improve the problem, the only way is to adjust the programming time of the current Id in the each AG-AND memory 100, but the problem solving method is very complex and can not be accomplished easily.

Figure 2:
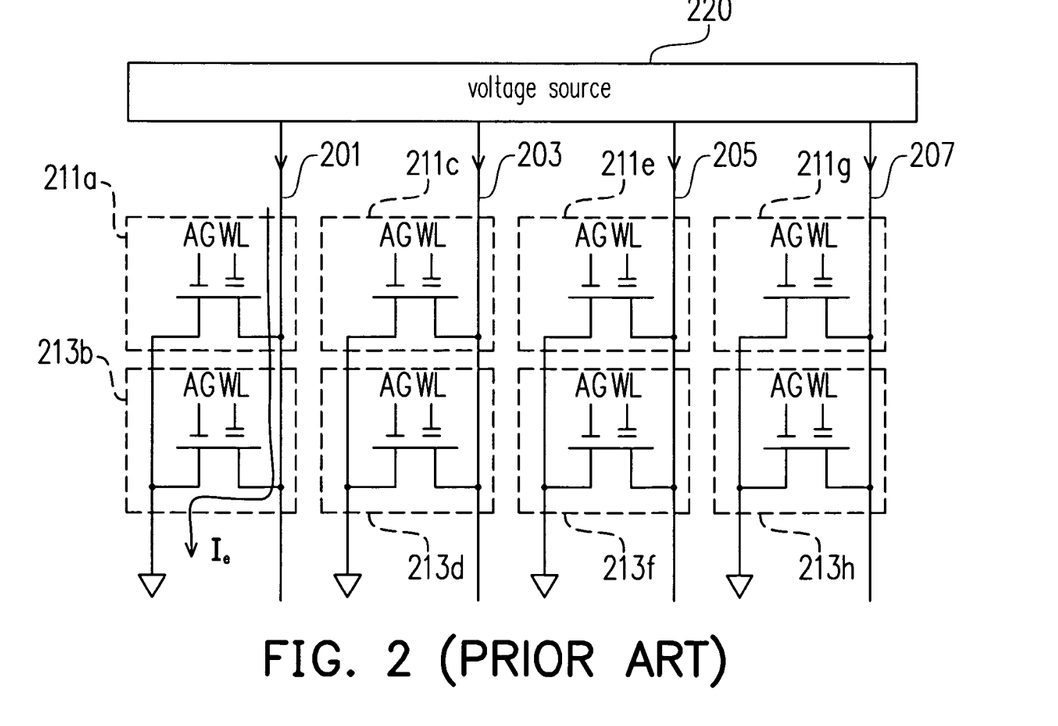
FIG. 2 is a drawing, schematically showing a circuit of a conventional array type AG-AND memory.

FIG. 2 is a drawing, schematically showing a circuit of a conventional array type AG-AND memory. As shown in FIG.2, the array type AG-AND memory includes four data lines 201 to 207, the each data line includes two set AG-AND memory components 211 and 213. All of the above mentioned data lines are coupled to the same voltage source 220, and by the voltage source 220 the current Id is supplied to each of the data lines 201 to 213. Further, the current amount supplied by the voltage source 220 can be even distributed to each of the data lines.

Supposing that the gross current amount supplied by the conventional voltage source 220 is 1.2 mA, then the maximum current Id supplied to each of the data lines is 0.3 mA, the current Id can perform the storage program of electrons to one set of the AG-AND memory components in each of the data lines thereof. But, when supposing that, owing to a short-cut accident, a set leakage current Ie is generated at the terminals Vd and Vs of the AG-AND memory component 213b in the data line 201, the data line not only must originally supply the current Id for the AG-AND memory component 211a, but also have to supply a additional current for the leakage current Ie, therefore, though originally the current amount 0.3 mA can be even distributed to each of the data lines, because that the leakage current Ie is generated, the current amount, which all of the AG-AND memory components can be obtained, is changed which can cause a mistake to the data storing in the memories in the whole array circuit, of course the serious mistake is not expected by circuit designers.

SUMMARY OF THE INVENTION

An aspect of the present invention is to provide a non-volatile memory circuit, wherein the non-volatile memory circuit utilizes a constant charge type to perform a program action of injecting and storing electric charges to a memory component, for solving the problem caused by difference of physical structure at manufacture process of the memory component.

Another aspect of the present invention is to provide a program method of non-volatile memory circuit, wherein, the program method of non-volatile memory circuit utilizes a constant charge type to store electric charges needed by each set memory component, for improving the situation of the mistake of internal storing data, which the mistake is generated by an array type non-volatile memory when the leakage current is caused.

The present invention provides a non-volatile memory circuit, which comprises a first switch, a second switch, a data line, and a plurality of memory components connected in series. Wherein, the first terminal of the first switch is coupled to the first voltage. The data line is coupled to the second terminal of the first switch. The first terminal of the second switch is coupled the data line. In addition, the third terminal of each memory component of the memory components is coupled to the first terminal of the next memory component, and the second terminal of the each memory component is coupled to second voltage, wherein a first terminal of the first memory component of the memory components is coupled to a second terminal of the second switch.

In accordance with an embodiment of the present invention, the data line comprises a parasitic capacitor for storing a voltage provided by the first voltage.

In accordance with another embodiment of the present invention, the non-volatile memory circuit further comprises a voltage storage component, wherein a first terminal of the voltage storage component is coupled to the data line, and a second terminal of the voltage storage component is coupled to ground.

In accordance with another embodiment of the present invention, the above mentioned parasitic capacitor and voltage storage component are used together for storing the voltage provided by the first voltage.

In accordance with the preferred embodiments of the present invention, the voltage storage component is a capacitor for storing a voltage provided by the first voltage, wherein the capacitor can be a parasitic capacitor of the data line.

In accordance with the preferred embodiments of the present invention, the first switch comprises a MOSFET.

In accordance with the preferred embodiments of the present invention, the second switch comprises a MOSFET.

In accordance with the preferred embodiments of the present invention, the memory component is one of NOR type memory component, NAND type memory component and AND type memory component.

In accordance with the preferred embodiments of the present invention, the non-volatile memory circuit further comprises a first decoder, which is coupled between the first terminal of the first memory component of the memory components and the second terminal of the second switch, for deciding whether or not a discharge path of the voltage storage component is conducted.

In accordance with the preferred embodiments of the present invention, the non-volatile memory circuit further comprises a second decoder, which is coupled between the first terminal of the voltage storage component and the first voltage, for deciding whether or not a charge path of the voltage storage component is conducted.

In accordance with the preferred embodiments of the present invention, the non-volatile memory circuit further comprises a third decoder, which is coupled between the second terminal of the memory components and the second voltage, for deciding whether or not the memory components are conducted.

In accordance with the preferred embodiments of the present invention, the non-volatile memory circuit further comprise a third switch, wherein a first terminal of the third switch is coupled between a third terminal of the last memory component in the memory components and the data line, wherein the memory components are NROM type memory component.

In accordance with the preferred embodiments of the present invention, the non-volatile memory circuit further comprise a third switch, wherein a first terminal of the third switch is coupled between a third terminal of the last memory component in the memory components and the data line, wherein the memory components are PHINES type memory component.

In accordance with the preferred embodiments of the present invention, the non-volatile memory circuit further comprise a third switch, wherein a first terminal of the third switch is coupled between a third terminal of the last memory component in the memory components and the data line, wherein the memory components are SONOS type memory component.

In accordance with the preferred embodiments of the present invention, the third switch comprises a MOSFET.

The present invention provides a program method of non-volatile memory circuit, which comprises a plurality of memory units, wherein each of the memory units comprises a first switch, a second switch, a data line, and a plurality of memory components connected in series. Wherein, a first terminal of the first switch is coupled to a first voltage, the data line is coupled to a second terminal of the first switch, and a first terminal of the second switch is coupled to the data line. Further, in the memory components, a third terminal of the each memory component is coupled to a first terminal of the next memory element, a second terminal of the each memory component is coupled to a second voltage, wherein, a first terminal of the first memory component of the memory components is coupled to a second terminal of the second switch. Further, a charge storage structure is included in each of the memory components for storing charges injected therein.

In accordance with the program method of non-volatile memory circuit of the present invention, first, the first switch is conducted for which the first voltage performs a charging action to a voltage storage component, wherein at the step, the second switch is at non-conduct state. Further, the first switch is non-conducted, the voltage storage component stores electric charges provided by the first voltage. Further, the second switch is conducted, the voltage storage component performs a discharge action to the memory component, and programs a storage state of the memory component. Finally, the second switch is non-conducted.

In accordance with the preferred embodiments of the present invention, the conducting times of the second switch and the first switch are at different time periods.

In accordance with the preferred embodiments of the present invention, the voltage storage component performs a charging action when the first switch is at conducting state.

In accordance with the preferred embodiments of the present invention, the voltage storage component performs a discharging action to the memory components when the second switch is at conducting state.

Because that the present invention utilizes the constant charge type to perform the actions of injecting and storing electric charges, therefore, the mistake action of the memory components can not be caused even that the differences exist in all the current paths of the memory components. Further, with the method, the normal operation of the memory components can not be affected even that the situation of the leakage current occurs among the memory components.

The above is a brief description of some deficiencies in the prior art and advantages of the present invention. Other features, advantages and embodiments of the invention will be apparent to those skilled in the art from the following description, accompanying drawings and appended claims.

DESCRIPTION OF THE PREFERRED EMBODIMENTS

The present invention provides a program method and circuit of non-volatile memory, which the most typical characteristic is that a sustained charge type is utilized to perform an action of injecting electric charges to a memory component in a memory, so that enough electric charge amount can certainly be injected to each of the memory components for performing a correct program action.

Figure 3A:
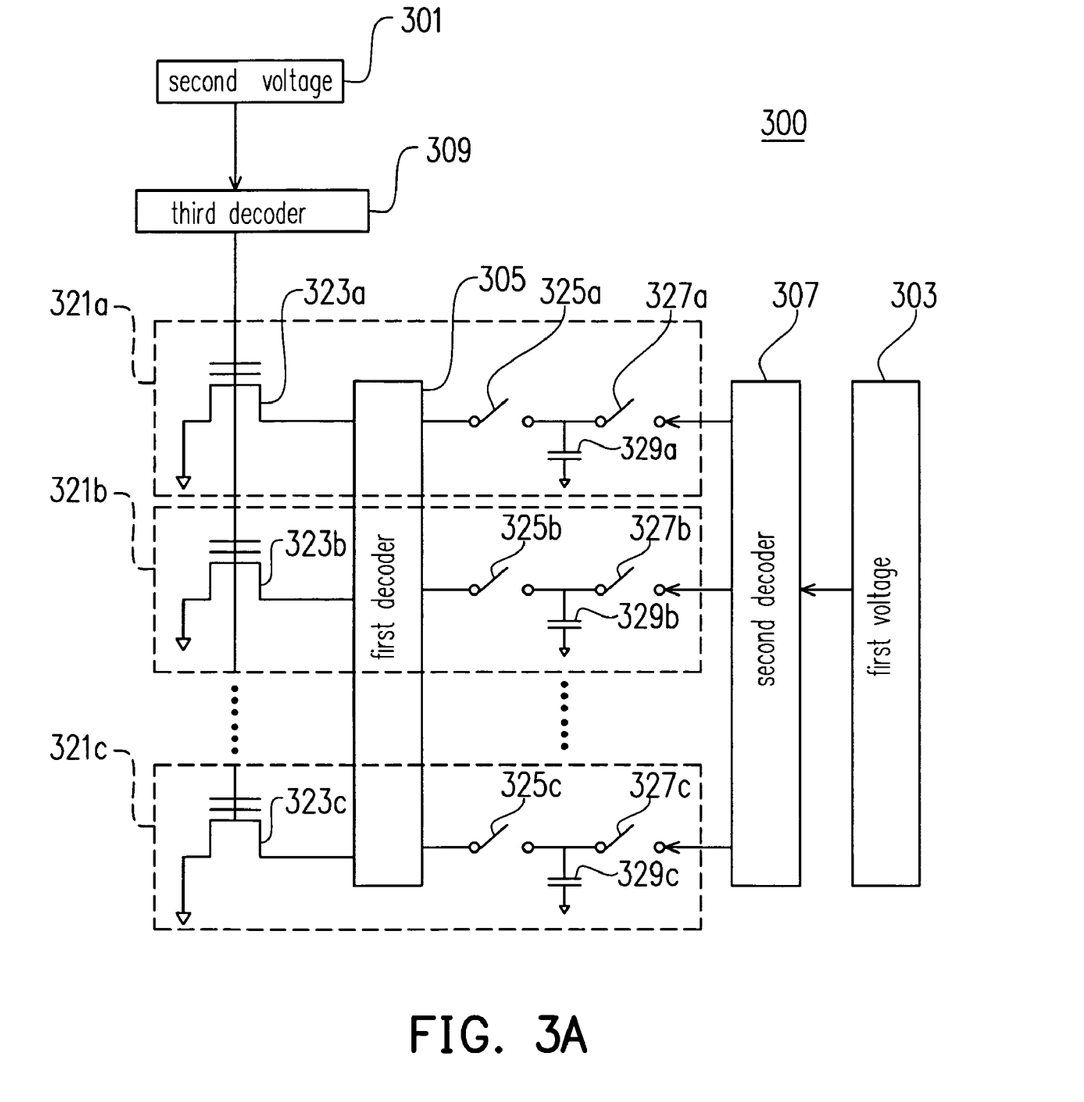
FIG. 3A is a drawing, schematically showing a structure of internal circuit of a non-volatile memory circuit according to an embodiment of the present invention.

FIG. 3A is a drawing, schematically showing a structure of internal circuit of a non-volatile memory circuit according to an embodiment of the present invention. As shown in FIG. 3A, the non-volatile memory 300 comprises three memory units 321a, 321b and 321c, of course, the non-volatile memory 300 can comprise more memory units by those skilled in the art.

Further, the above mentioned non-volatile memory further comprised two set voltage sources which are a first voltage 303 and a second voltage 301. Wherein, in each of the above mentioned memory units 321, all comprises second switches 325, first switches 327, voltage storage components 329 and memory components 323. It should be noted that, the voltage storage components 329 can be a parasitic capacitor of each bit line connected to each of the memory components 323, or, the voltage storage components 329 can be an external capacitor as well. The following description is performed with the current structure of the memory unit 321a.

In the memory unit 321a, a first terminal of the first switch 327a is coupled to the first voltage 303, a first terminal of the voltage storage component 329a is coupled to a second terminal of the first switch 327a, and a second terminal of the voltage storage component 329a is coupled to the ground. Wherein, the first switch 327a is utilized to control whether or not the current path, between the first voltage 303 and the voltage storage component 329a, is conducted.

Further, a first terminal of the second switch 325a is coupled to the first terminal of the voltage storage component 329a, a first terminal of the memory component 323a is coupled to a second terminal of the second switch 325a, a second terminal of the memory component 323a is coupled to the second voltage 301, a third terminal of the memory component 323a is coupled to the ground. Wherein, the second switch 325a is utilized to control whether or not the current path, between the voltage storage component 329a and the memory component 323a, is conducted.

Wherein, the second switch 325a and the first switch 327a are conducted at different time periods, which means that the second switch 325a is at a non-conduct state when the first switch 327a is at a conduct state, therefore, in the mean time only the current loop from the first voltage 303 to the voltage storage component 329a exists, so that the voltage storage component 329a can perform a charging action and store electric charges in the voltage storage component 329a.

Whereas, the second switch 325a is at a conduct state when the first switch 327a is at a non-conduct state, therefore, the current loop from the first voltage 303 to the voltage storage component 329a is non-conducted, but the current loop from the voltage storage component 329a to the memory component 323a is formed, the electric charges, which is originally stored in the voltage storage component 329a, can perform a discharge action through the current loop formed with the memory component 323a.

In the embodiments of the present invention, the above mentioned memory component 323a is one of common NOR type memory component, NAND type memory component and AND type memory component. Wherein, a second terminal of the memory component 323a is coupled to the second voltage, for controlling whether or not the current loop, between the first terminal and the third terminal of the memory component 323a, is conducted.

When the current loop, between the second switch and the first terminal of the memory component 323a, has been formed already, and when the voltage storage component 329a starts to perform a discharge action, the current can flow from the first terminal into the memory component 323a, in the mean time part of the electric charges (electron or electric hole) can be absorbed, injected and stored into the charge storage structure of the memory component 323a, for accomplishing the action of programming the memory component 323a.

The current flows from the third terminal to the first terminal of the memory cell 323 when the second voltage 301 is positive. Further, the current flows from the first terminal to the substrate of the memory cell 323 when the second voltage 301 is negative. Different programming operations can be performed under the two situations mentioned above, and different types of charges will be injected.

Wherein, because that the correct amount of the electric charges, which have to be injected into the second terminal of the memory component 323a, can be calculated out by the circuit designer at the beginning of designing the circuit, therefore at designing the circuit, the suitable voltage storage component 329a can be disposed to store the correct electric charges according to the electric charge amount which is stored in the charge storage structure of the memory component 323a.

When the voltage storage component 329a starts to perform the discharge action, the already formed current path can be utilized for injecting and storing suitable amount electric charge into the charge storage structure of the memory component 323a, so that, even the physical structure in the memory components 321a, 321b and 321c of each memory unit are not the same and the injecting time is therefore affected, all of the electric charges which are stored in the voltage storage component 329a can be injected into the memory component 323a with a certain proportion because that the present invention performs the sustaining discharge action. Because the charges stored in the voltage storage component 329a are nearly at a constant value (because the stored voltage is nearly constant), the charges can be used to inject into the memory component 323a or other memory components can be controlled such that the variation of the injected charges is reduced. Therefore, the present invention can solve the problem of that, owing to difference at the physical structure of the memory components, the correct electric charges can not be stored into the memory component.

The above mentioned memory component 323 can be one of the three structures, SONOS, NROM and PHINES. The non-volatile memory circuit should choose a proper structure according to characteristics that the non-volatile memory circuit would have. For example, NROM could be adapted for hot electron programming operation, PHINES could be adapted for band-to-band hot hole programming operation, and SONOS could be adapted for FN channeling-effect programming operation. In the embodiment, charges are injected into the charge storage structure of the memory component 323 for storing the charges by using hot-electron or hot-hole injection. The charge storage structure includes a first isolating layer, a charge trapping layer and a second isolating layer.

Figure 3B:
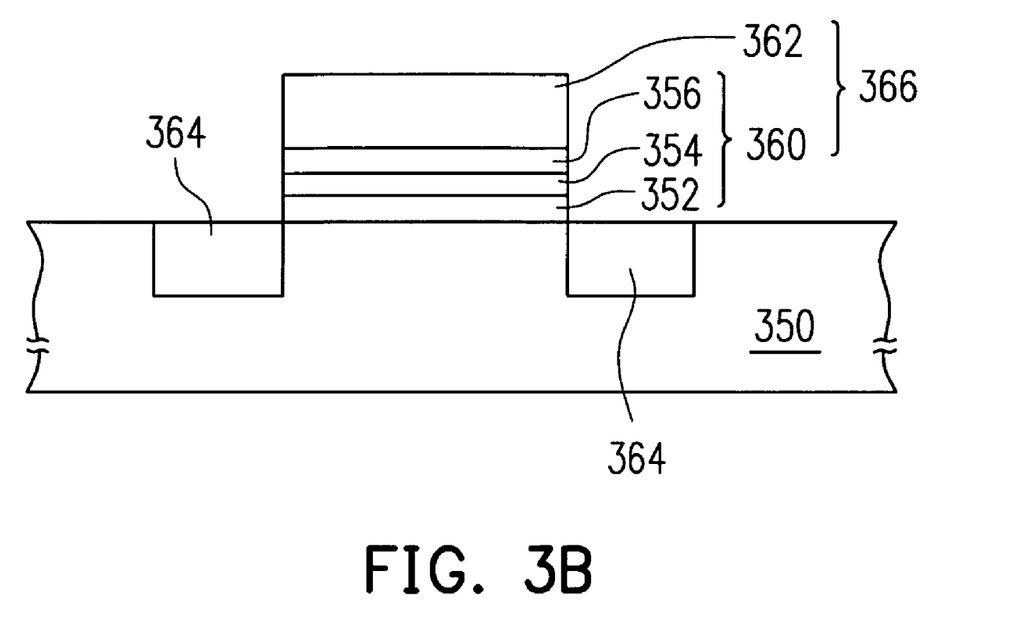
FIG. 3B is a drawing, schematically showing a structure of SONOS memory cell.

Referring to FIG. 3B, a structure of SONOS memory cell is schematically shown therein. The SONOS memory cell includes a substrate 350, a composition layer 360 includes nitride layer 352/354/356, a gate 362 and source/drain 364. The gate 362 and the composition layer 360 forms the gate structure 366.

Besides, in the embodiments of the present invention, the above mentioned voltage storage components 329 can be a capacitor for storing the voltage supplied by the first voltage 303, and the capacitor can be a common dielectric capacitor, a junction capacitor, or of course other parasitic capacitor. And the above mentioned second switch 325 and first switch 327 can be a MOSFET type switch.

In the embodiments of the present invention, the non-volatile memory circuit 300 possesses a matrix type with a paralleled array, in order to more easily control the storage state of the memory component 323 of each memory unit 321 in the non-volatile memory 300, three decoders, which are a first decoder 305, a second decoder 307 and a third decoder 309, can be designed additionally.

Wherein, the first decoder 305 is coupled between the first terminal of the memory component 323 of the each memory unit 321 and the second terminal of the second switch 325, the first decoder 305 can decide to conduct the charge paths of the memory components 323 in the time periods, wherein, the second decoder 307 is coupled between the first voltage 303 and the first terminal of the first switch 327 in the each memory unit 321, the second decoder 307 can decide to conduct the charge paths of the voltage storage components 329 in the time periods.

Further, the above mentioned third decoder 309 is coupled between the second voltage 301 and the second terminal of the memory component 321 in the memory unit 321, the third decoder 309 can decide to conduct the current paths of the memory components 321 in the time periods. Therefore, when the decoders are additionally designed in the non-volatile memory circuit 300, the second switch 325 and the first switch 327 in the circuit can be switched with a constant time period, and further the current paths of the current loops are controlled and conducted by the above mentioned decoders, for the convenience of the circuit design.

Figure 4:
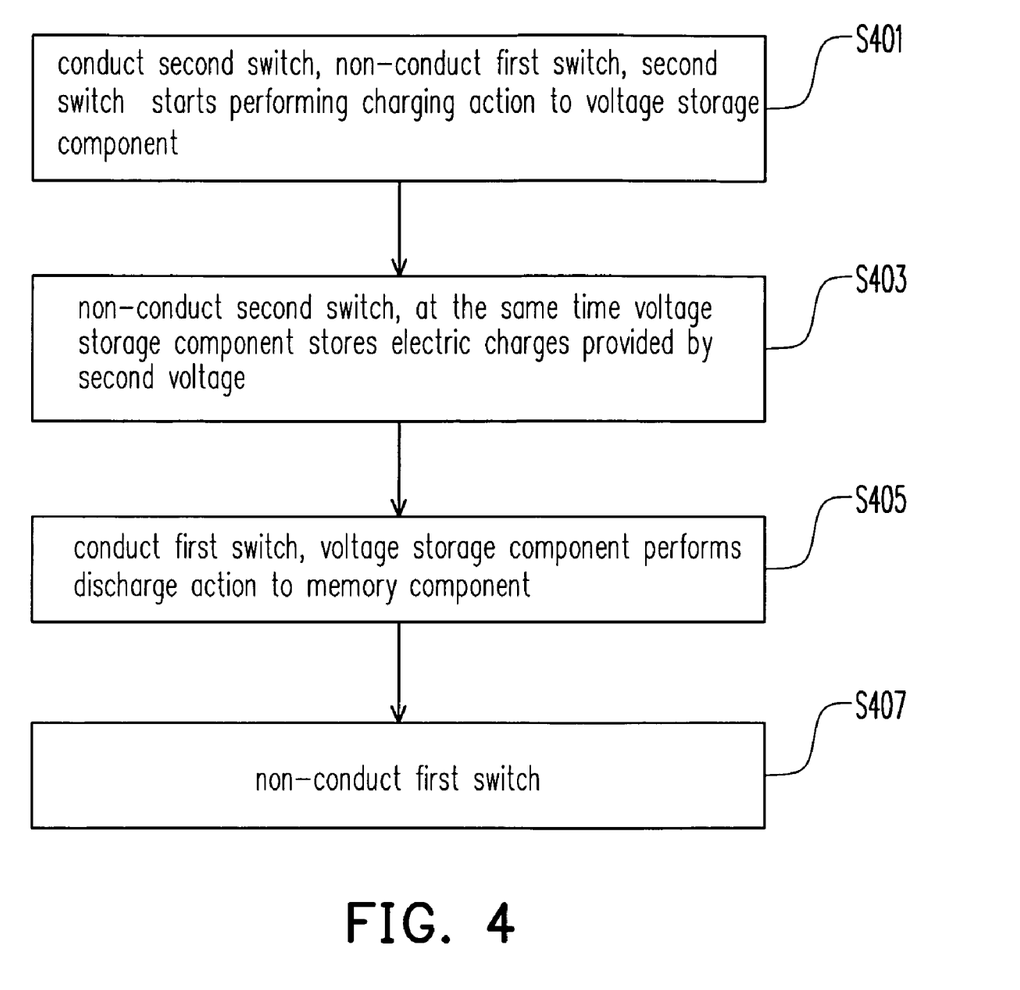
FIG. 4 is a drawing, schematically showing a flow chart of programming method of a non-volatile memory circuit according to an embodiment of the present invention.

FIG. 4 is a drawing, schematically showing a flow chart of programming method of a non-volatile memory circuit according to an embodiment of the present invention. The following description is performed with the circuit of the memory unit 321a as shown in FIG. 3. As shown in FIG. 4, in the step S401, the first switch 327a is at the conduct state, and the second switch 325a is at non-conduct state, the states are the above mentioned that the conduct states of the second switch 325a and the first switch 327a in the same time period are at the contrary states.

In the step S401, because that the second switch 325a is at the non-conduct state, only one current loop is formed which is the current loop of the first voltage 303 and the voltage storage component 329a, so that the first voltage 303 can start performing the charging action to the voltage storage component 329a.

Further, in the step S403, the state of first switch can be converted to the non-conduct state, therefore the original current loop can disappear, and the electric charges, which are already occurred at charging to the voltage storage component 329a, can be stored in the voltage storage component 329a. Further in the step S405, the state of second switch 325a can be converted to the conduct state, therefore, the current loop of the second switch 325a to the memory component 323a is formed in the mean time.

In the mean time, when the second voltage 301 provides an enabled voltage to the memory component 323a for conducting the current into the memory component 323a, the electric charges which is pre-stored in the voltage storage component 329a perform a discharge action to the memory component 323a, during the process, a certain amount of the electric charges can be injected and stored into the charge storage structure of the memory component 323a, so that the program action of the memory component 323a is therefore accomplished.

Furthermore, in the step S407, when the discharge action of the voltage storage component 329a has been accomplished already, the second switch 325a is at the non-conduct state again and waits the program action at next time period. Of course, though the description is performed only with the memory unit 321a as example as shown in FIG. 3.and FIG. 4, the program actions of all the memory units are the same as the memory 321a because that the inside structure of the each memory units 321a, 321b and 321c are the same.

Figure 5:
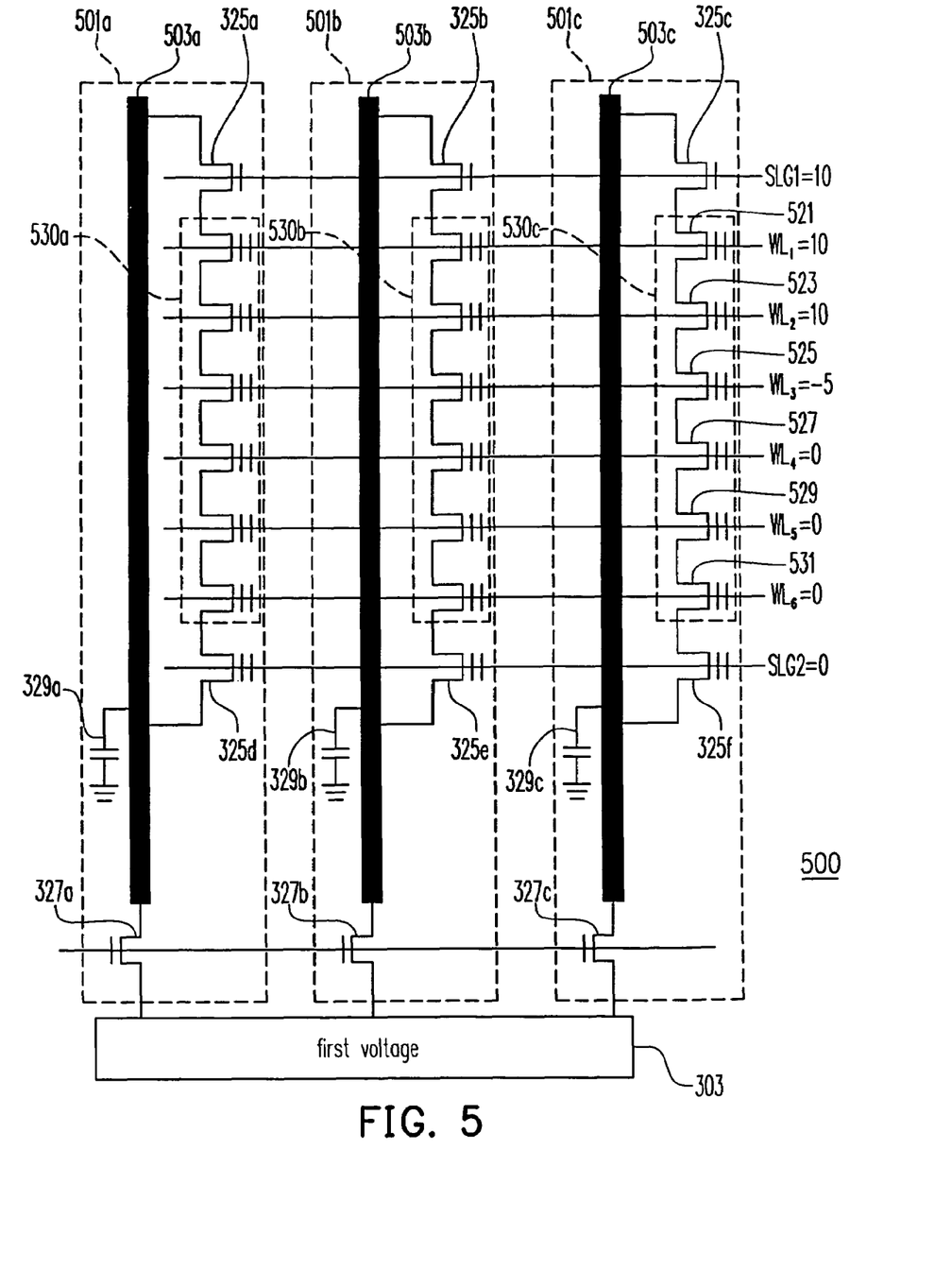
FIG. 5 is a drawing, schematically showing another structure of internal circuit of a non-volatile memory circuit according to an embodiment of the present invention.

FIG. 5 is a drawing, schematically showing another structure of internal circuit of a non-volatile memory circuit according to an embodiment of the present invention. As shown in FIG. 5, the non-volatile memory 500 comprises three memory units 501a, 501b and 501c, wherein, each of memory units 501 comprises a data line 503, a second switch 325, a first switch 327, a voltage storage component 329 and a plurality of memory units 530, wherein the data line comprise a metal conductor.

Wherein, in accordance with the embodiment of the present invention as shown in FIG. 3, the first switches 327a, 327b and 327c of the memory units 501a, 501b and 501c are respectively coupled to a first voltage 303, and each of the memory units 501a, 501b and 501c can decide whether or not the current loop from the first voltage 303 to the data lines 503a, 503b and 503c is conducted according to the conduct states of the first switches 327a, 327b and 327c. Wherein, in accordance with the embodiment of the present invention, the first switches 327a, 327b and 327c can be a NMOS transistor, of course, the first switches 327a, 327b and 327c in the embodiment of the present invention are utilized to provide a switch convert function, any other component with the same function can also be utilized in the embodiment of the present invention.

Further, in accordance with the embodiment of the present invention, the voltage storage components 329a, 329b, 329c (as a whole referred to 329) of the memory units 501a, 501b and 501c can comprise a capacitor which is the same as in the embodiment of the present invention as shown in FIG. 3, wherein, a first terminal of the capacitor is coupled to the data line 503 of the memory unit 501, a second terminal is coupled to the ground. When the first switch 327 of the memory unit 501 is at a conduct state, a current loop between the first voltage 303 and the voltage storage component 329 can be formed, therefore electric charges provided by the first voltage 303 can be stored in the voltage storage components 329.

Further, the second switches 325 in each of the memory units 501 is utilized to provide a switch convert function, any other component with the same function can also be utilized in the embodiment of the present invention. The second switches 325 in the embodiment of the present invention are a select transistor, a first terminal of the select transistor is coupled to the data line 503, a second terminal receives a control voltage SLG (including one of the first control voltage SLG1 and the second control voltage SLG2), a third terminal is coupled to an input terminal of the memory components 530 connected in series.

Wherein, the second terminal of the select transistor is a gate electrode, and the second switch 325 decides whether or not the current loop from the data line 503 to the input terminal of the memory components 530 is conducted according to the control voltage SLG which is coupled to the gate electrode. Of course, the conduct periods of the second switch 325 and the first switch 327 shown as FIG. 5 are the same with the actions of the embodiment as shown in FIG. 3, which can not be conducted together in the same time period, it means that the current loop of the input of the memory components 530 and the data line 503 is not exist when the voltage storage component 329 is at the charge state, vice versa.

In accordance with the embodiment of the present invention, the memory components 530 comprise multi memory components which can be one of common NOR type memory component, NAND type memory component and AND type memory component. Wherein, the third terminal of the each memory component is coupled to the first terminal of the next memory component, and the second terminal of the memory component is coupled to a second voltage WL, for controlling whether or not the current loop of the first terminal and the third terminal of the memory component is conducted. The following description is performed with the memory component 501*c*.

Assuming when the memory component 527 of the memory unit 325*c* is predetermined by the non-volatile memory 500, first, the second switch 325*c* is programmed at the non-conduct state and the first switch 327*c* is programmed at the conduct state, therefore, the current loop between the first voltage 303 and the voltage storage component 329*c* are formed at the same time, in the mean time the voltage storage component 329*c* starts performing a charge action.

When the first switch is converted to the non-conduct state, the second switch is converted to the conduct state at the same time, therefore the electric charges, which are originally stored in the voltage storage component 329*c*, start performing a discharge action to the memory components 530*c*. In accordance with the embodiment of the present invention, the first control voltage SLG1 is 10 V for maintaining the second switch at the conduct state.

In accordance with the embodiment of the present invention, when the second voltage WL is 10V, though the current loop of the first terminal and the third terminal of the memory component is formed, the charge storage structure of the memory component can not absorb electric charges and can not perform programming the storage. When the second voltage WL is −5V, not only the current loop of the first terminal and the third terminal of the memory component is formed, but also the charge storage structure of the memory component can absorb electric charges and perform programming the storage. When the second voltage WL is 0V, the current loop of the first terminal and the third terminal of the memory component is non-conducted.

In the programming process at this time, the state of the memory component 525 is programmed mainly, therefore the second voltage of the each memory component of the memory unit 501*c* is programmed as follows: the voltages of WL1 and WL2 are 10V, the voltage of WL3 is −5V, the voltages of other WL are 0V, therefore when the voltage storage component 329*c* stats performing the discharge action, the memory component 527 can absorb and store the electric charges into the charge storage structure, whereas the memory components 521 and 523 can provide only one current loop path, and the memory components 529 and 531 are at non-conduct state.

Further, the memory components in the present invention can be the NROM type memory component. Because that all of two terminals of the NROM type memory component can perform storing electric charge program, in order to coordinate the NROM type memory component, a second switch 325*f* can be additionally designed in the memory components 503*c*, of course, in the embodiment of the present invention, the second switch 325*f* can also be the select transistor.

Wherein, the first terminal of the second switch 325*f* is coupled to the data line 503, the second terminal receives the second control voltage SLG2, the third terminal is coupled to the third terminal of the last memory component 531 of the memory components 503*c*. When the non-volatile memory circuit 500 programs the memory component 527 of the memory components 503*c*, the conducting current path direction can be decided according to the program states of the control voltages SLG1 and SLG2, and the memory component 503*c* can decide the terminal of storing electric charges according to the current direction.

In summary of the above mentioned, the on-volatile memory of the present invention utilizes the sustained charge type to perform the program action to the memory component for injecting and storing enough electric charges in the memory component, therefore, the mistake action of the memory components can not be caused even that the differences exist in the current paths of the memory components owing to the manufacturing factor. Further, with the method, the normal operation of the memory components can not be affected even that the situation of the leakage current occurs among the memory components. Further, the non-volatile memory not needs adding any outer positive circuit, therefore not needs providing additional electrical power. Further, the type can be utilized to design the circuit for multi-level cell non-volatile memory. Furthermore, the control circuit of the non-volatile memory type is very simple and is very convenient in usage.

The above description provides a full and complete description of the preferred embodiments of the present invention. Various modifications, alternate construction, and equivalent may be made by those skilled in the art without changing the scope or spirit of the invention. Accordingly, the above description and illustrations should not be construed as limiting the scope of the invention which is defined by the following claims.

What is claimed is:

1. A non-volatile memory circuit, comprising a plurality of memory units, wherein each of the memory units comprises:
   a first switch, wherein a first source/drain terminal of the first switch is coupled to a first voltage;
   a data line, wherein the data line is directly connected to a second source/drain terminal of the first switch;
   a second switch, wherein a first source/drain terminal of the second switch is directly connected to the data line; and
   a plurality of memory components which are connected in series, a second source/drain terminal of each of the memory components is coupled to a first source/drain terminal of a next memory component next to the memory component, a gate terminal of each of the memory components is coupled to a second voltage respectively, wherein a first source/drain terminal of a first one of the memory components is coupled to a second source/drain terminal of the second switch.

2. The non-volatile memory circuit of claim 1, wherein the data line comprises a parasitic capacitor for storing a voltage provided by the first voltage.

3. The non-volatile memory circuit of claim 1, further comprises a voltage storage component, wherein a first terminal of the voltage storage component is coupled to the data line, a second terminal of the voltage storage component is coupled to ground.

4. The non-volatile memory circuit of claim 3, wherein the voltage storage component is a capacitor for storing a voltage provided by the first voltage.

5. The non-volatile memory circuit of claim 1, wherein the first switch comprises a MOSFET.

6. The non-volatile memory circuit of claim 1, wherein the second switch comprises a MOSFET.

7. The non-volatile memory circuit of claim 1, wherein the memory component is one of NOR type memory component, NAND type memory component and AND type memory component.

8. The non-volatile memory circuit of claim 1, wherein the memory component is of SONOS type or PHINES type.

9. The non-volatile memory circuit of claim 8, wherein the memory component stores charges by using hot-electron or hot-hole injection.

10. The non-volatile memory circuit of claim 9, wherein a charge storage structure includes a charge trapping layer.

11. The non-volatile memory circuit of claim 10, wherein the charge trapping layer includes nitride.

12. The non-volatile memory circuit of claim 10, wherein the charge storage structure includes a first isolating layer, the charge trapping layer and a second isolating layer.

13. The non-volatile memory circuit of claim 1, further comprising a first decoder, coupling between the first source/drain terminal of the first memory component of the memory components and the second source/drain terminal of the second switch, for deciding whether or not a discharge pat of the voltage storage component is conducted.

14. The non-volatile memory circuit of claim 1, further comprising a second decoder, coupling between the first source/drain terminal of each of the memory components and the first voltage, for deciding whether or not a charge path of the voltage storage component is conducted.

15. The non-volatile memory circuit of claim 1, further comprising a third decoder, coupling between the gate terminal of each of the memory components and the second voltage, for deciding whether or not any one of the memory components is conducted.

16. The non-volatile memory circuit of claim 1, further comprising a third switch, wherein a first source/drain terminal of the third switch is coupled between a second source/drain terminal of a last one of the memory components and the data line, wherein the memory components arc a NROM type memory component.

17. The non-volatile memory circuit of claim 16, wherein the third switch comprises a MOSFET.

18. A program method of non-volatile memory circuit, comprising a plurality of memory units, wherein each of the memory units comprises a first switch, a second switch, a data line and a plurality of memory components connected in series, wherein, a first source/drain terminal of the first switch is coupled to a first voltage, the data line is directly connected to a second source/drain terminal of the first switch, a first source/drain terminal of the second switch is directly connected to the data line, in the memory components, a second source/drain terminal of each of the memory components is coupled to a first source/drain terminal of a next memory component next to the memory component, a gate terminal of each of the memory components is coupled to a second voltage, wherein, a first source/drain terminal of a first one of the memory components is coupled to a second source/drain terminal of the second switch, wherein the program method of non-volatile memory circuit comprises:

conducting the first switch, wherein, the first voltage performs a charge action to a voltage storage component, the second switch is at a non-conduct state;

non-conducting the first switch, wherein the voltage storage component stores electric charges provided by the first voltage;

conducting the second switch, wherein, the voltage storage component performs a discharge action to the memory component, and programs a storage state of the memory component; and non-conducting the second switch, wherein, the second voltage is utilized to decide whether the memory component is at one of a conducting state, a storing electric charge state and a non-conducting state.

19. The program method of non-volatile memory circuit of claim 18, wherein the conduct times of the second switch and the first switch are at different time periods.

20. The non-volatile memory circuit of claim 2, wherein the parasitic capacitor stores a constant amount of charges provided by the first voltage.

* * * * *